(12) United States Patent
Kang et al.

(10) Patent No.: US 8,520,434 B2
(45) Date of Patent: Aug. 27, 2013

(54) METHOD OF STORING E-FUSE DATA IN FLASH MEMORY DEVICE

(75) Inventors: Sang-gu Kang, Suwon-si (KR); Young-ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 13/198,241

(22) Filed: Aug. 4, 2011

(65) Prior Publication Data

US 2011/0286278 A1    Nov. 24, 2011

Related U.S. Application Data

(62) Division of application No. 12/052,935, filed on Mar. 21, 2008, now abandoned.

(30) Foreign Application Priority Data

May 29, 2007    (KR) .......................... 10-2007-0052194

(51) Int. Cl.
*G11C 11/34*    (2006.01)
*G11C 16/06*    (2006.01)

(52) U.S. Cl.
USPC ................ 365/185.09; 365/185.17; 365/200

(58) Field of Classification Search
USPC ............ 365/185.02, 185.09, 185.17, 94–105, 365/200
See application file for complete search history.

(56) References Cited

U.S. PATENT DOCUMENTS

| | | | |
|---|---|---|---|
| 5,029,131 A * | 7/1991 | Vancu ....................... 365/185.03 |
| 6,052,313 A | 4/2000 | Atsumi et al. |
| 7,057,940 B2 | 6/2006 | Hsu et al. |
| 7,440,322 B2 | 10/2008 | Kamei |
| 2006/0023549 A1 | 2/2006 | Son et al. |
| 2007/0033449 A1 | 2/2007 | Hwang et al. |

FOREIGN PATENT DOCUMENTS

| | | | |
|---|---|---|---|
| KR | 1020050040350 A | 5/2005 |
| KR | 1020060089345 A | 8/2006 |

* cited by examiner

*Primary Examiner* — Harry W Byrne
*Assistant Examiner* — Lance Reidlinger
(74) *Attorney, Agent, or Firm* — Volentine & Whitt, PLLC (57) ABSTRACT

Provided is a method of storing configuration data regarding an operating environment of a flash memory device, which includes a memory cell array having an electrical fuse (E-Fuse) block for storing the configuration data. The method includes storing the configuration data in multiple strings of the E-Fuse block, each string including multiple memory cells configured to store one bit.

25 Claims, 14 Drawing Sheets

METHOD OF STORING E-FUSE DATA IN FLASH MEMORY DEVICE

CROSS-REFERENCE TO RELATED PATENT APPLICATION

This application is a Divisional application of application Ser. No. 12/052,935, filed Mar. 2, 2008, which claims priority to Korean Patent Application No. 10-2007-0052194, filed on May 29, 2007, the subject matter of which is hereby incorporated by reference.

BACKGROUND OF THE INVENTION

1. Field of the Invention

The present invention relates to a flash memory device, and more particularly, to a method of storing configuration data in an electrical fuse (E-Fuse) block of a flash memory device.

2. Description of the Related Art

A flash memory is a nonvolatile memory device which can be electrically erased and reprogrammed. Flash memories have power consumption lower than that of a recording medium based on a magnetic disk memory, and an access time as fast as a hard disk of the magnetic disk memory.

Flash memory devices may be classified as NOR type flash memories or NAND type flash memories, in which cell transistors and bit lines are connected. In a NOR type flash memory device, at least two cell transistors are connected in parallel with a single bit line. The NOR type flash memory device stores data using a channel hot electron method and erases data using a Fowler-Nordheim (F-N) tunneling method. A NAND type flash memory device has at least two cell transistors serially connected to a single bit line. The NAND type flash memory device stores and erases data using the F-N tunneling method.

Generally, a NOR type flash memory consumes a lot of power, and thus cannot be highly integrated. However, a NOR type flash memory has a high operating speed. In contrast, a NAND type flash memory uses less cell current than a NOR type flash memory, and thus is suitable for high integration.

Figure 1A:
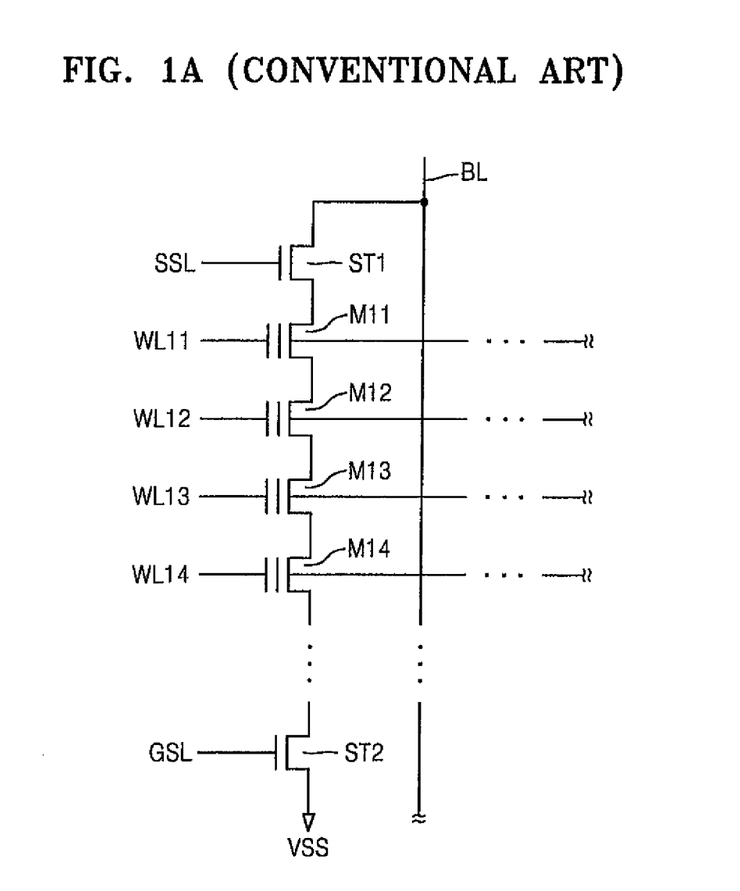
FIG. 1A is a circuit diagram of a conventional NAND type flash memory.

FIG. 1A is a circuit diagram of memory cells included in a conventional NAND type flash memory device. Referring to FIG. 1A, the conventional NAND type flash memory device includes memory cells M11, M12, M13 and M14, multiple wordlines WL11, WL12, WL3 and WL14, select transistors ST1 and ST2, and a bit line BL. The memory cells M11, M12, M13 and M14 form a string structure with the select transistors ST1 and ST2, and are connected in series between a bit line BL and a ground voltage VSS. The conventional NAND type flash memory uses a low cell current, and thus all the memory cells connected to a single wordline are programmed in one program operation.

Figure 1B:
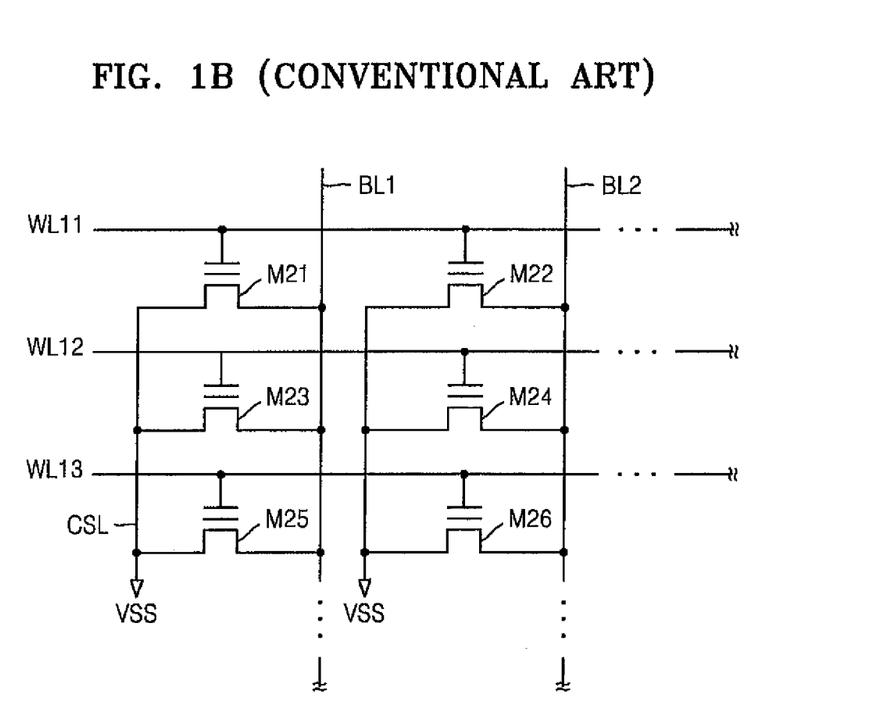
FIG. 1B is a circuit diagram of a conventional NOR type flash memory.

FIG. 1B is a circuit diagram of a conventional NOR type flash memory. Referring to FIG. 1B, the conventional NOR type flash memory includes memory cells M21 through M26 connected between bit lines BL1 and BL2 and a source line CSL. The conventional NOR type flash memory consumes a lot of power and involves high current consumption while performing a program operation, and thus a the NOR type flash memory programs a predetermined number of memory cells through a one-time programming operation.

Generally, various types of information required in operating a memory should be included in a memory device. For example, an electrical fuse (E-Fuse) method is a method of storing the various types of information in a memory cell instead of a conventional laser fuse, reading the information when a memory chip operates, turning ON/OFF a corresponding switch, and transmitting the information. Information stored in an E-Fuse form may include DC trim information for operating a memory chip, option information, repair and bad block information, and the like. Such information for operating a memory chip is pre-stored while testing a certain area of a memory cell.

When power is applied to a memory chip, the above information is stored in a latch of the memory chip through a data reading process, and the corresponding switch is turned ON/OFF using the stored information. Various DC level values are set up using the information for operating a memory, and defective columns and defective blocks can be repaired.

However, configuration data stored in E-Fuse form (hereinafter, referred to as E-Fuse data) may not be reliable, because the configuration data cannot use the DC trim information and is read using a DC level setup as a default. The E-Fuse data may be incorrectly read based on changes of the default DC level due to process variations, for example. Also, the E-Fuse data may be incorrectly read due to a read disturb phenomenon or a coupling phenomenon that may occur by repeatedly reading the E-Fuse data.

Accordingly, when E-Fuse data related to operating a memory is read, errors may occur due to changes in the operating environment of a memory device. Thus, reading operations of the E-Fuse data may be unreliable and cannot be guaranteed

SUMMARY OF THE INVENTION

The present invention provides a flash memory device and a method of storing electrical fuse (E-Fuse) data, which can improve reliability of reading operations of configuration data of a flash memory device stored in E-Fuse form.

According to an aspect of the present invention, there is provided a method of storing configuration data regarding an operating environment of a flash memory device, the flash memory device including a memory cell array having an electrical fuse (E-Fuse) block for storing the configuration data. The method includes storing the configuration data in multiple strings of the E-Fuse block, each string including multiple memory cells configured to store one bit.

The configuration data may include DC trim information, option information, repair information and bad block information, used for operating the flash memory device.

Each bit value of the configuration data may be stored in one memory cell of each corresponding string. Also, the configuration data may be stored in adjacent memory cells of the multiple strings connected to one word line.

Each bit value of the configuration data may be stored in multiple of memory cells of each corresponding string. The configuration data may be stored in adjacent memory cells of the multiple strings connected to multiple word lines. The word lines may be adjacent to each other or separated from each other by at least one intervening word line.

The E-Fuse block may include a first area which stores the configuration data, and a second area which does not store the configuration data. The first area is in a first state or a second state according to a bit value stored therein. The second area is in the first state. For example, the first state may be an erase state and the second state may be a program state.

The configuration data may be stored in a first word line and a second word line in a zigzag formation. The first word line and the second word line may be adjacent to each other or separated from each other by at least one intervening word line.

The configuration data may be stored in a first word line group and a second word line group in a zigzag formation, where each word line group includes multiple memory cells storing the same bit value. The first word line group and the second word line group may be adjacent to each other or separated from each other by at least one intervening word line. Also, the multiple memory cells in each word line group may be adjacent to each other or separated from each other by at least one intervening memory cell on a corresponding string.

According to another aspect of the present invention, there is provided a method of storing configuration data regarding an operating environment of a flash memory device, the flash memory device including a memory cell array having an electrical fuse (E-Fuse) block for storing the configuration data. The method includes storing the configuration data in multiple strings of the E-Fuse block, the multiple strings being separated from each other. Each string of the multiple strings includes multiple memory cells configured to store one bit.

When the strings of the E-Fuse block include a first string through an nth string in order of location, the configuration data may be stored in the 2k−1$^{th}$ strings, where n and k are natural numbers.

Each bit value of the configuration data may be stored in one memory cell of each corresponding string.

Each bit value of the configuration data may be stored in multiple memory cells of each corresponding string, where the configuration data may be stored in memory cells connected to multiple word lines. The word lines may be adjacent to each other or separated from each other by at least one intervening word line.

The memory cells of the E-Fuse block that do not store the configuration data may be in an erase state.

BRIEF DESCRIPTION OF THE DRAWINGS

The embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the present invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements and techniques are not described with respect to some of the embodiments of the present invention. Throughout the drawings and written description, like reference numerals will be used to refer to like or similar elements.

Figure 2:
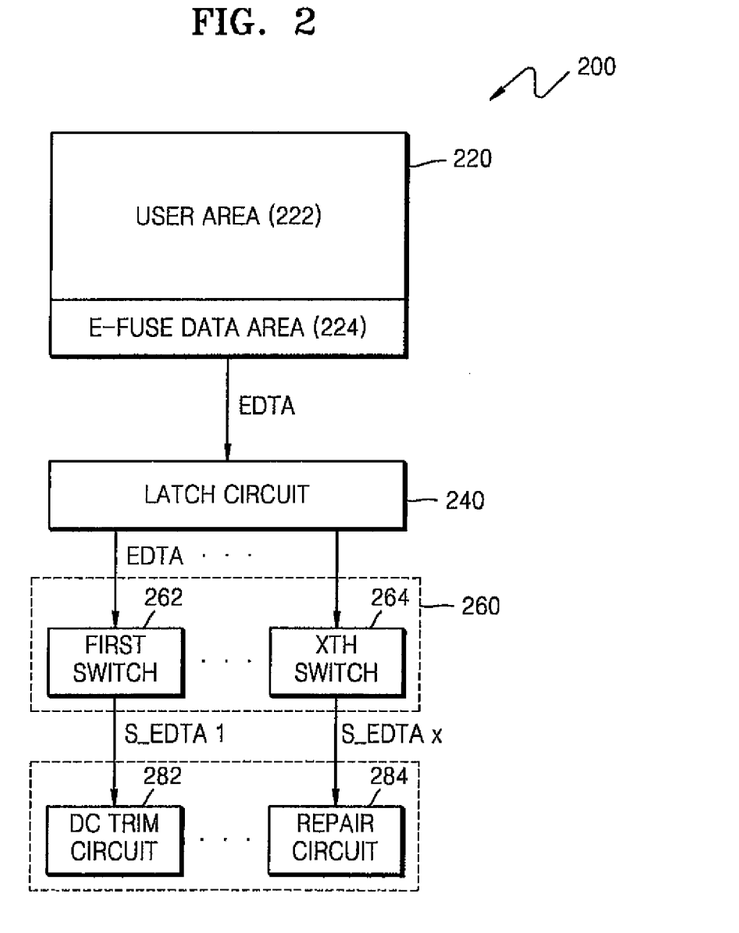
FIG. 2 is a block diagram of a flash memory device configured to set an operating environment of the flash memory device using electrical fuse (E-Fuse) data, according to an exemplary embodiment of the present invention.

FIG. 2 is a block diagram of a flash memory device 200, configured to set an operating environment of the flash memory device 200 using electrical fuse (E-Fuse) data.

Referring to FIG. 2, the flash memory device 200 includes a memory cell array 220, a latch circuit 240, a switch unit 260, and a DC trim circuit 282 and a repair circuit 284. The memory cell array 220 may include a user area 222 and an E-Fuse data area or block 224. The user area 222 may store user data and the E-Fuse data area 224 may store E-Fuse data EDTA. In the depicted embodiment, the E-Fuse data EDTA denotes configuration data required in operating the flash memory device 200. The E-Fuse data EDTA may include, for example, DC trim information, option information, repair information, bad block information, etc.

Figure 3:
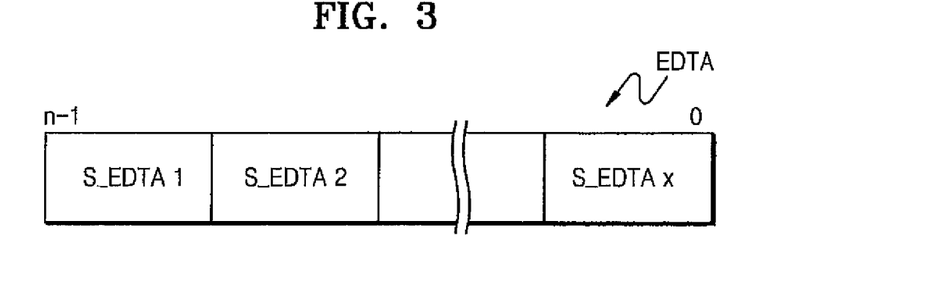
FIG. 3 is a diagram illustrating a basic structure of the E-Fuse data of FIG. 2, according to an exemplary embodiment of the present invention.

FIG. 3 is a diagram illustrating a basic structure of the E-Fuse data EDTA of FIG. 2, according to an illustrative embodiment of the present invention.

Referring to FIG. 3, the E-Fuse data EDTA includes multiple pieces of information regarding an operating environment of the flash memory device 200. For example, a predetermined number of upper bits S_EDTA1 from among n bits of the E-Fuse data EDTA may store DC trim information, a predetermined number of intermediate bits S_EDTA2 may store option information, and a predetermined number of lower bits S_EDTAx may store repair information.

A process of setting up an operating environment of the flash memory device 200 of FIG. 2 using the E-Fuse data EDTA will now be described. Referring again to FIG. 2, when power is applied to the flash memory device 200, an initial read operation for the E-Fuse data EDTA stored in the E-Fuse data area 224 is performed. The E-Fuse data EDTA read according to the initial read operation are stored in the latch circuit 240.

The E-Fuse data EDTA stored in the latch circuit 240 is sent to the switch unit 260. First through xth switches 262 and 264 of the switch unit 260 control the switching ON/OFF of the trim and repair circuits. For example, the first switch 262 controls the ON/OFF switching of the DC trim circuit 282 according to DC trim information S_EDTA1 of the E-Fuse data EDTA, and the xth switch 264 controls the ON/OFF switching of the repair circuit 284 according to repair information S_EDTAx of the E-Fuse data EDTA.

Methods of storing E-Fuse data according to illustrative embodiments of the present invention will now be described. First, common features of each embodiment will be described. In the diagrams of FIGS. 4 through 12, referred to below, memory cells are represented by squares. Specifically, memory cells storing E-Fuse data (configuration data) are represented by squares having a hatching pattern, and memory cells not storing E-Fuse data (e.g., storing user data) are represented by blank or white squares. Also, memory cells repeatedly storing the same bit value are in groups represented by dotted lines.

Figure 4:
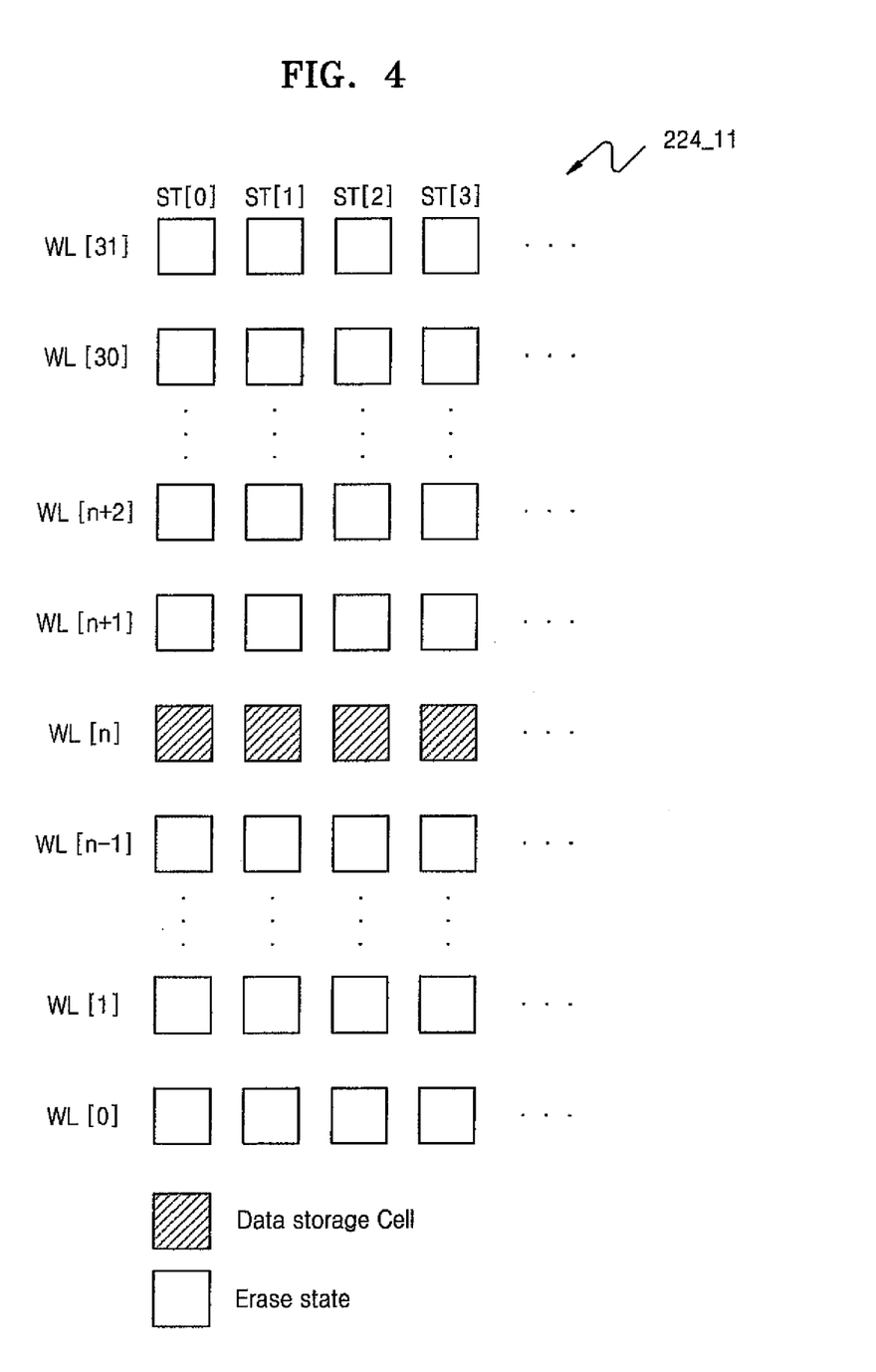
FIGS. 4 through 6 are diagrams illustrating methods of storing E-Fuse data, according to exemplary embodiments of the present invention.
Figure 5A:
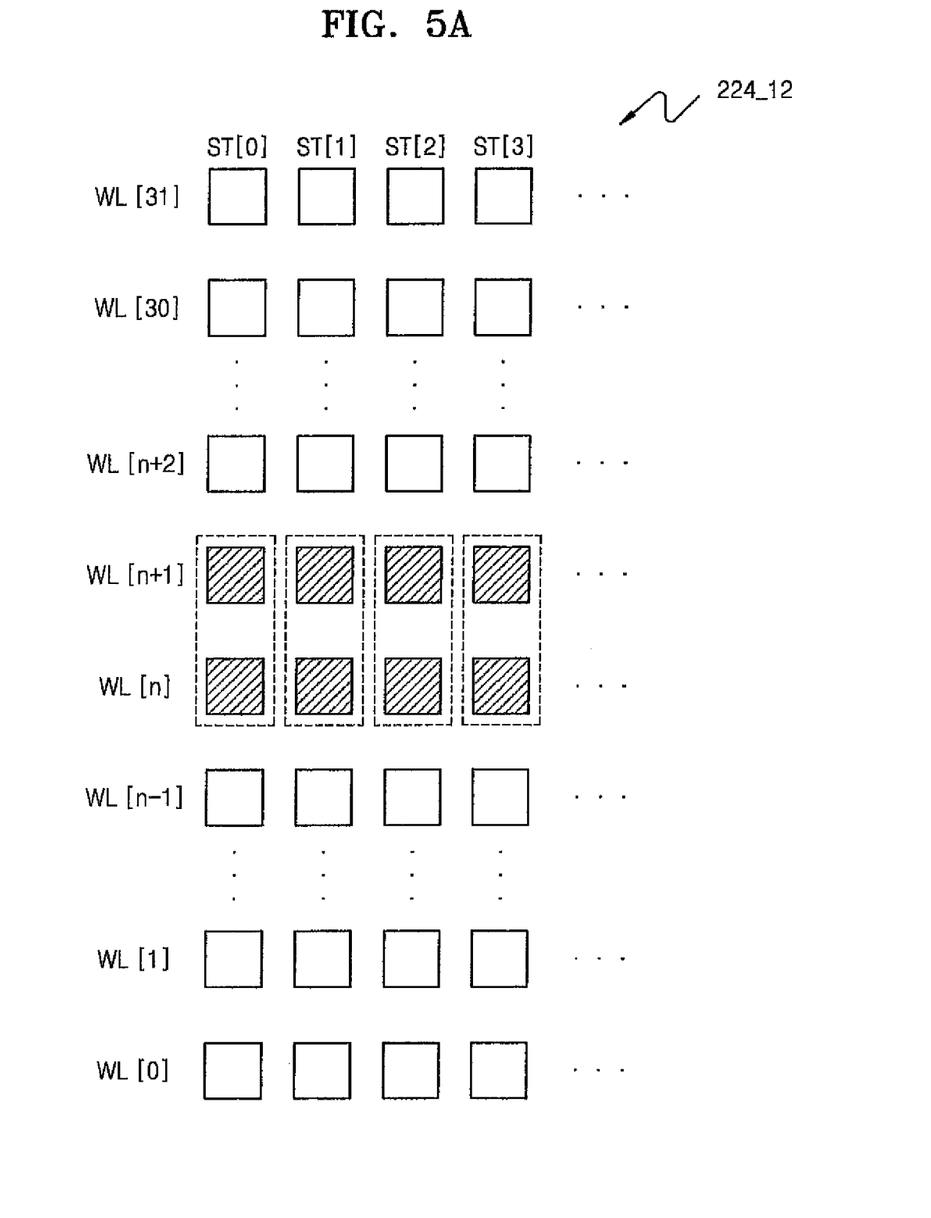
Figure 5B:
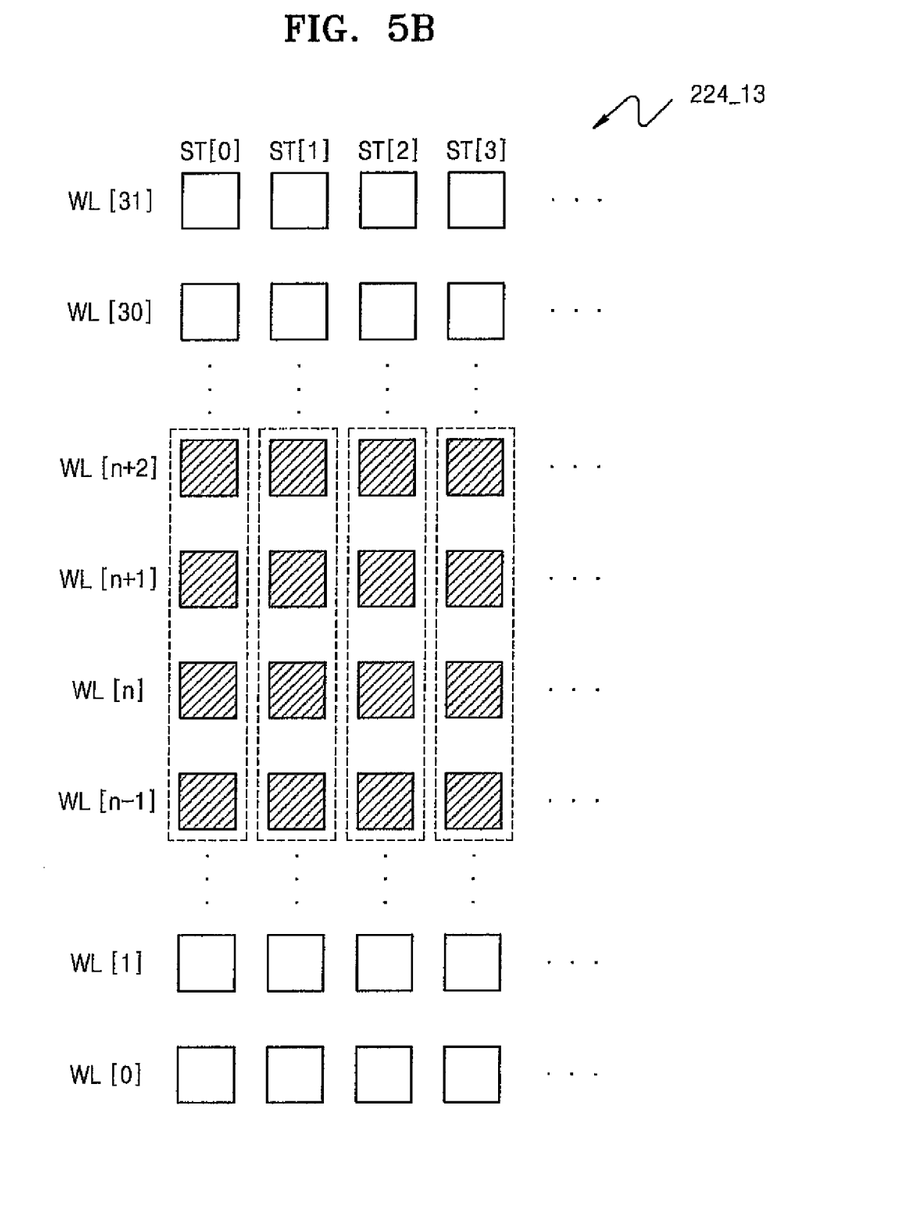
Figure 6:
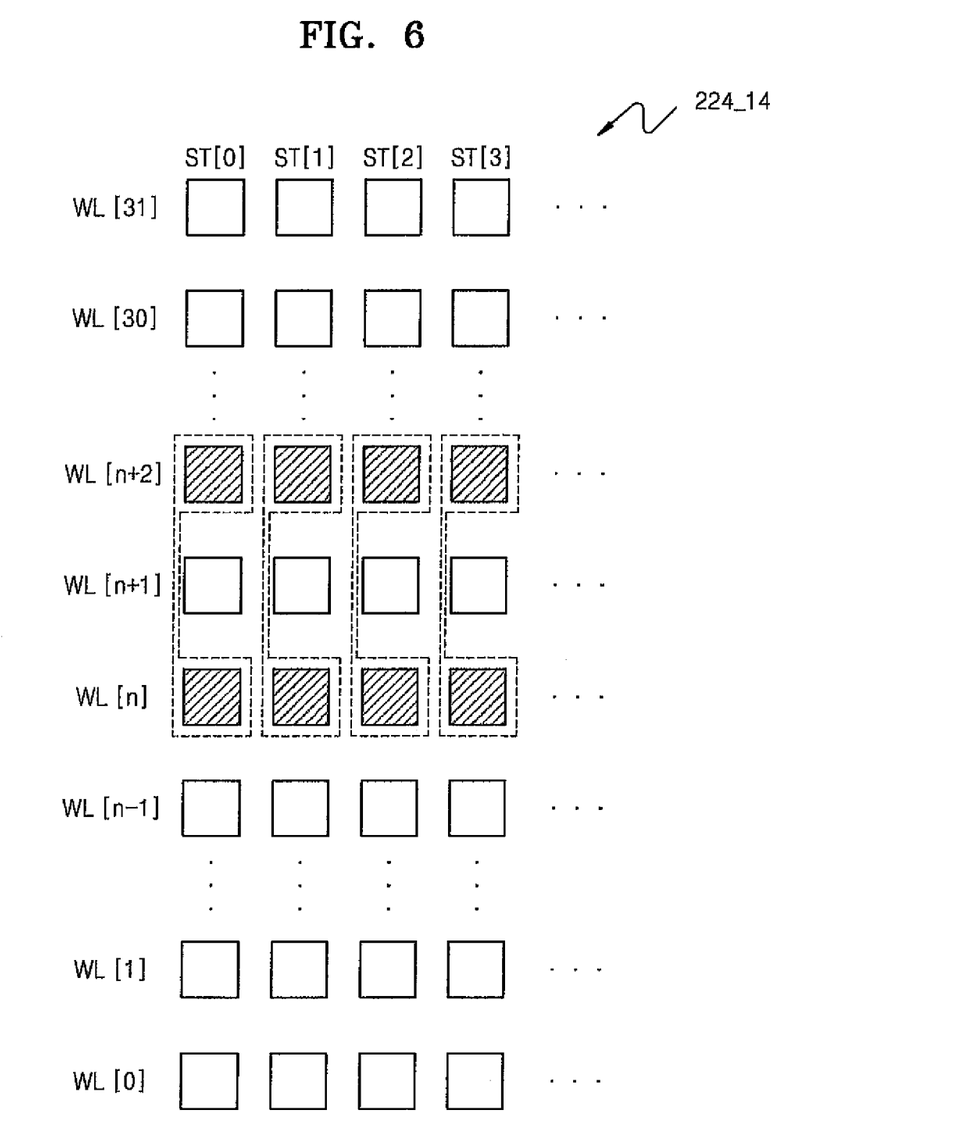

FIGS. 4 through 6 are diagrams illustrating methods of storing E-Fuse data EDTA, according to exemplary embodiments of the present invention.

Referring to FIGS. 4 through 6, in the depicted methods of storing E-Fuse data EDTA, the E-Fuse data EDTA are stored in each string of multiple strings ST[0], ST[1], ST[2] and ST[3] of an E-Fuse block, one bit per memory cell. The E-Fuse block may correspond to a portion of or the entire E-Fuse data area 224 of FIG. 2, for example. Also, in the depicted exemplary embodiment, each of the strings ST[0], ST[1], ST[2] and ST[3] includes 32 memory cells (squares) connected in series. In FIGS. 4 through 6, referring to the strings ST[0], ST[1], ST[2] and ST[3] of the E-Fuse block as first through nth strings in order of location, E-Fuse data EDTA are stored in the $2k^{th}$ strings, wherein n and k are natural numbers. For example, for k=1 and 2, the E-Fuse data EDTA are stored in the first and second strings ST[0] and ST[1].

The memory cells storing the E-Fuse data EDTA (hatched squares) can be in a program state or an erase state according to a stored bit value. Meanwhile, the memory cells not storing the E-Fuse data EDTA (white squares) can be in an erase state. However, the states of the memory cells are not limited. For example, the memory cells storing the E-Fuse data EDTA may be in a state other than a program state or an erase state, according to the stored bit value. Generally, in a flash memory device, a program state may be represented by a data value "0" and an erase state may be represented by a data value "1."

Referring to FIG. 4, the same bit value is stored in one memory cell of each of the strings ST[0], ST[1], ST[2] and ST[3]. Specifically, the E-Fuse data EDTA are continuously stored in memory cells connected to one word line WL[n].

Alternatively, referring to FIGS. 5A and 5B, the same bit value may be stored in multiple memory cells (hatched squares grouped within dotted lines) of each of the strings ST[0], ST[1], ST[2] and ST[3]. For example, the memory cells grouped in the dotted lines in FIGS. 5A and 5B may all be in a program state or an erase state. In other words, in the method of FIGS. 5A and 5B, a plurality of the same E-Fuse data EDTA values are stored in each string. Further, as shown in FIGS. 5A and 5b, the E-Fuse data EDTA values are continuously stored in adjacent memory cells connected to a corresponding word line.

Specifically, in FIG. 5A, the same bit value is stored in two adjacent memory cells of each of the strings ST[0], ST[1], ST[2] and ST[3], and in FIG. 5B, the same bit value is stored in four adjacent memory cells of each of the strings ST[0], ST[1], ST[2], and ST[3]. Thus, as illustrated in FIGS. 5A and 5B, multiple word lines WL[n] through WL[n+1] or WL[n−1] through WL[n+2] may be continuously located.

Alternatively, the word lines connected to the memory cells storing the E-Fuse data EDTA may be separated from each other by intervening word line(s). Referring to FIG. 6, for example, two word lines WL[n] and WL[n+2] storing grouped E-Fuse data EDTA are separated from each other by word line WL[n+1]. However, the number of intervening word lines separating word lines storing the E-Fuse data EDTA is not limited to one. For example, two or more word lines, such as the word lines WL[n−1] through WL[n+2] of FIG. 5B, may be separated from each other by two intervening word lines (WL[n] and WL[n+1]).

As described above, in the method of storing E-Fuse data EDTA according to the exemplary embodiments of the present invention illustrated in FIGS. 4 through 6, a memory cell connected to one string stores only one bit value. Each string may store the one bit value in one memory cell or repeatedly store the same bit value in multiple memory cells.

Each of the memory cells not storing the E-Fuse data EFTA is in an erase state. In other words, according to the methods of storing E-Fuse data EDTA according to the depicted embodiments, the memory cells not storing the E-Fuse data EDTA, from among the memory cells respectively connected to each of the strings ST[0], ST[1], ST[2] and ST[3], operate as pass transistors.

Also, according to the methods of the depicted embodiments, an advantageous read margin may be obtained during a read operation, since there is no back pattern effect (i.e., an effect on a cell being read caused by pattern(s) of other cell(s) in the same string). For example, storing one bit value in multiple memory cells, as illustrated in FIGS. 5A and 5B, can prevent incorrectly reading the E-Fuse data EDTA due to charge loss, even when the charge loss occurs in some memory cells.

Figure 7:
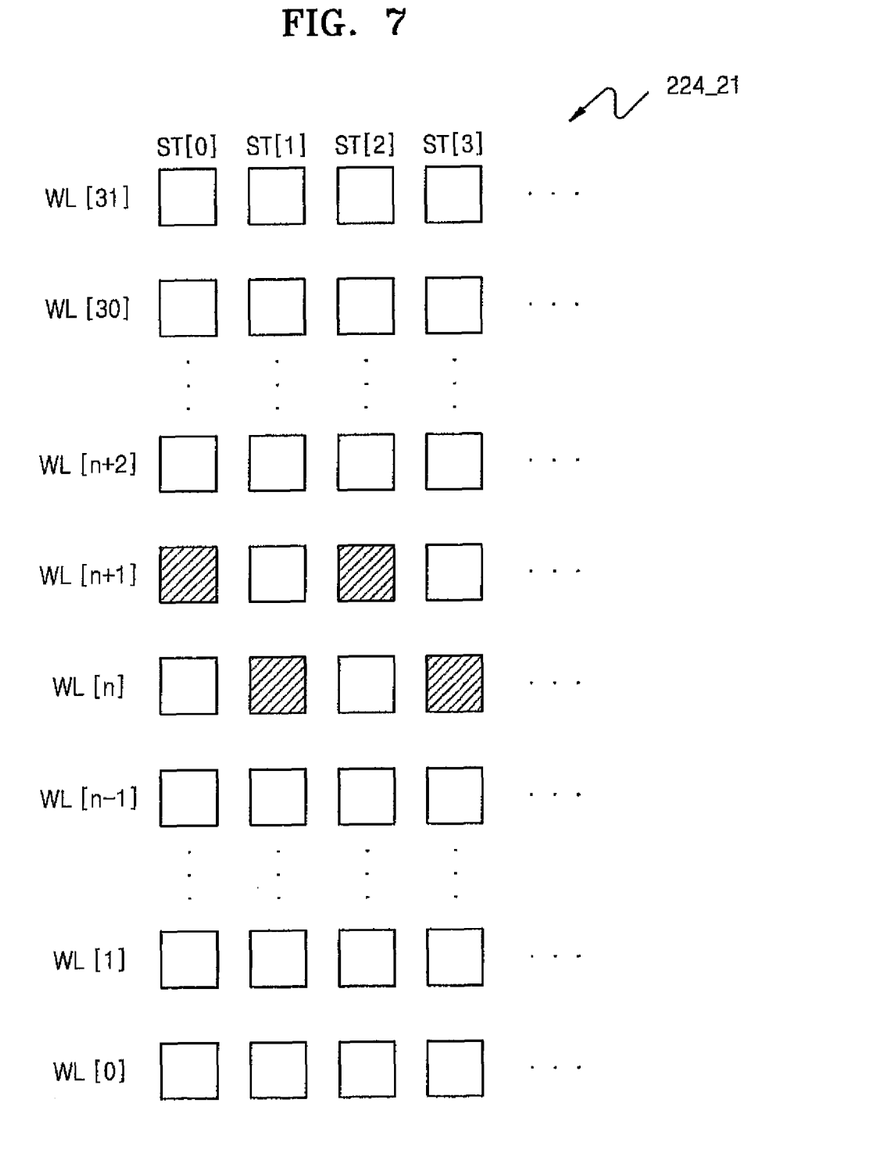
FIGS. 7 through 9 are diagrams illustrating methods of storing E-Fuse data, according to exemplary embodiments of the present invention.
Figure 8:
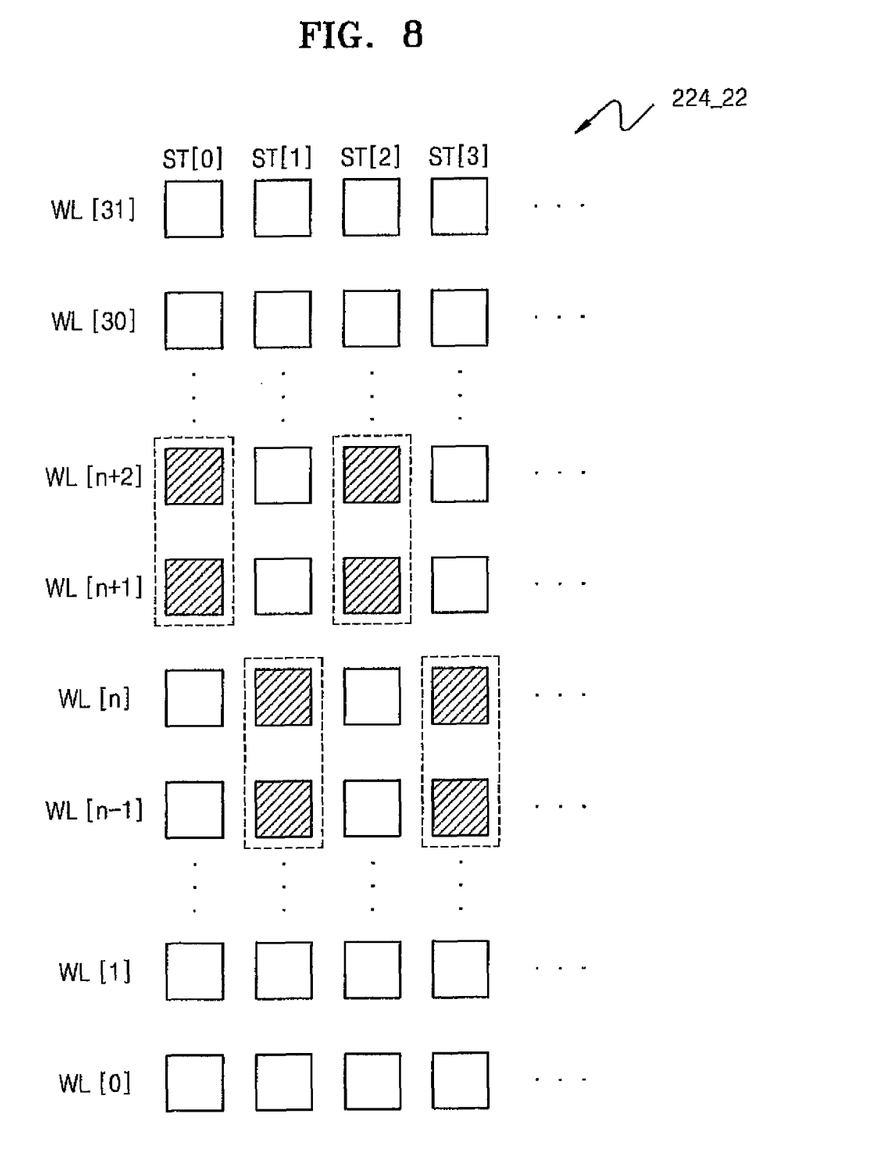
Figure 9:
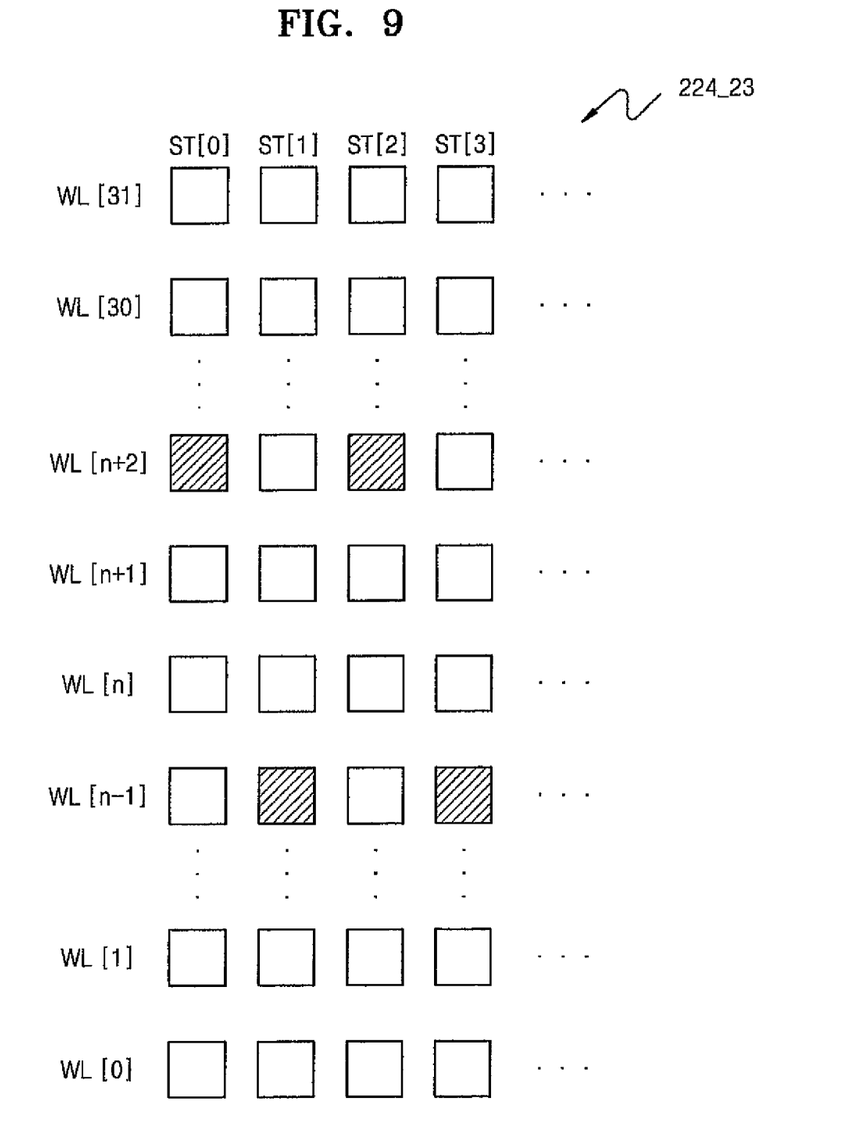

FIGS. 7 through 9 are diagrams illustrating methods of storing E-Fuse data EDTA, according to additional exemplary embodiments of the present invention.

Referring to FIGS. 7 through 9, in the depicted methods of storing E-Fuse data EDTA, the E-Fuse data EDTA are stored in each string of multiple strings ST[0], ST[1], ST[2] and ST[3] of an E-Fuse block, one bit per memory cell, similar to the preceding methods. Also, memory cells not storing the E-Fuse data EDTA (white squares) of FIGS. 7 through 9 may be in an erase state, as in the previously described methods. However, in the depicted alternative embodiments, the E-Fuse data EDTA are not continuously stored in memory cells connected to the same predetermined word line of all strings.

In detail, referring to FIG. 7, the same bit value is stored in one memory cell of each of the strings ST[0], ST[1], ST[2] and ST[3]. Specifically in FIG. 7, the E-Fuse data EDTA are stored in a first word line WL[n] and a second word line WL[n+1] in a zigzag formation. That is, the E-Fuse data EDTA are stored in the second and fourth strings ST[1] and ST[3] of the first word line WL[n] and the first and third strings ST[0] and ST[2] of the second word line WL[n+1]. The first word line WL[n] and the second world line WL[n+1] may be adjacent to one another, as shown. Alternatively, the first and second word lines may be separated from each other by one or more intervening word lines. For example, in the zigzag formation illustrated in FIG. 9, the first word line WL[n−1] is separated from the second word line WL[n+2] by intervening word lines WL[n] and WL[n+1].

Referring to FIG. 8 the same bit value is stored in multiple memory cells (hatched squares grouped within dotted lines) of each of the strings ST[0], ST[1], ST[2] and ST[3]. Accordingly, in the method of FIG. 8, a plurality of the same E-Fuse data EDTA values are stored in each string. Specifically, in FIG. 8, the same bit value is stored in two memory cells of each of the strings ST[0], ST[1], ST[2] and ST[3], although the number of memory cells in a grouping is not limited to two.

Referring to FIG. 8, the E-Fuse data EDTA are stored in a first group of word lines WL[n−1] and WL[n] and a second group of word lines WL[n+1] and WL[n+2] in a zigzag formation. This means, for example, that groups of memory cells storing the E-Fuse data EDTA, corresponding to the groups of word lines, are located in every other string. The first group and the second group can be located in adjacent pairs of word lines, as shown in FIG. 8. Alternatively, the first group and the second group can be spaced apart from each other by one or more intervening word lines or groups of word lines.

Likewise, multiple memory cells storing the same bit value may be located adjacent to each other or separated from each other by intervening word lines on a corresponding string. In other words, the word lines within the first group and the second group, respectively, may be adjacent to one another, as shown in FIG. 8, or separated by one or more intervening word lines. For example, word lines WL[n−1] and WL[n] forming the first group can be adjacently located (as shown) or separated from each other by an intervening word line.

Using the methods of storing E-Fuse data EDTA according to the depicted embodiments of the present invention, a back pattern effect can be reduced by storing the same bit value in each string, as in the previous embodiments. Further, a coupling phenomenon, caused by adjacent memory cells while programming E-Fuse data EDTA, can be prevented since the E-Fuse data EDTA are not stored in adjacent memory cells. Accordingly, using the methods of storing E-Fuse data EDTA according to the depicted embodiments, the E-Fuse data EDTA can be reliably read.

Figure 10:
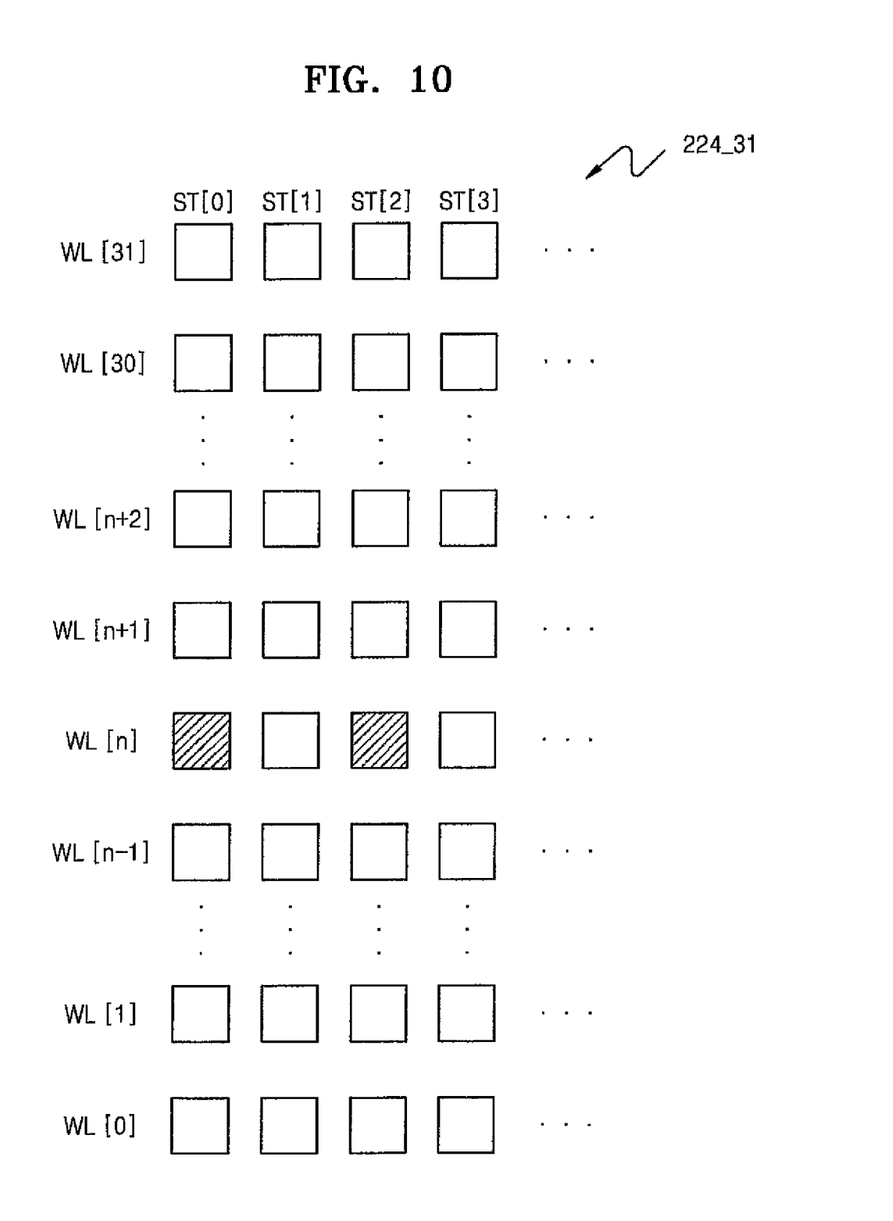
FIGS. 10 through 12 are diagrams illustrating methods of storing E-Fuse data, according to exemplary embodiments of the present invention.
Figure 11A:
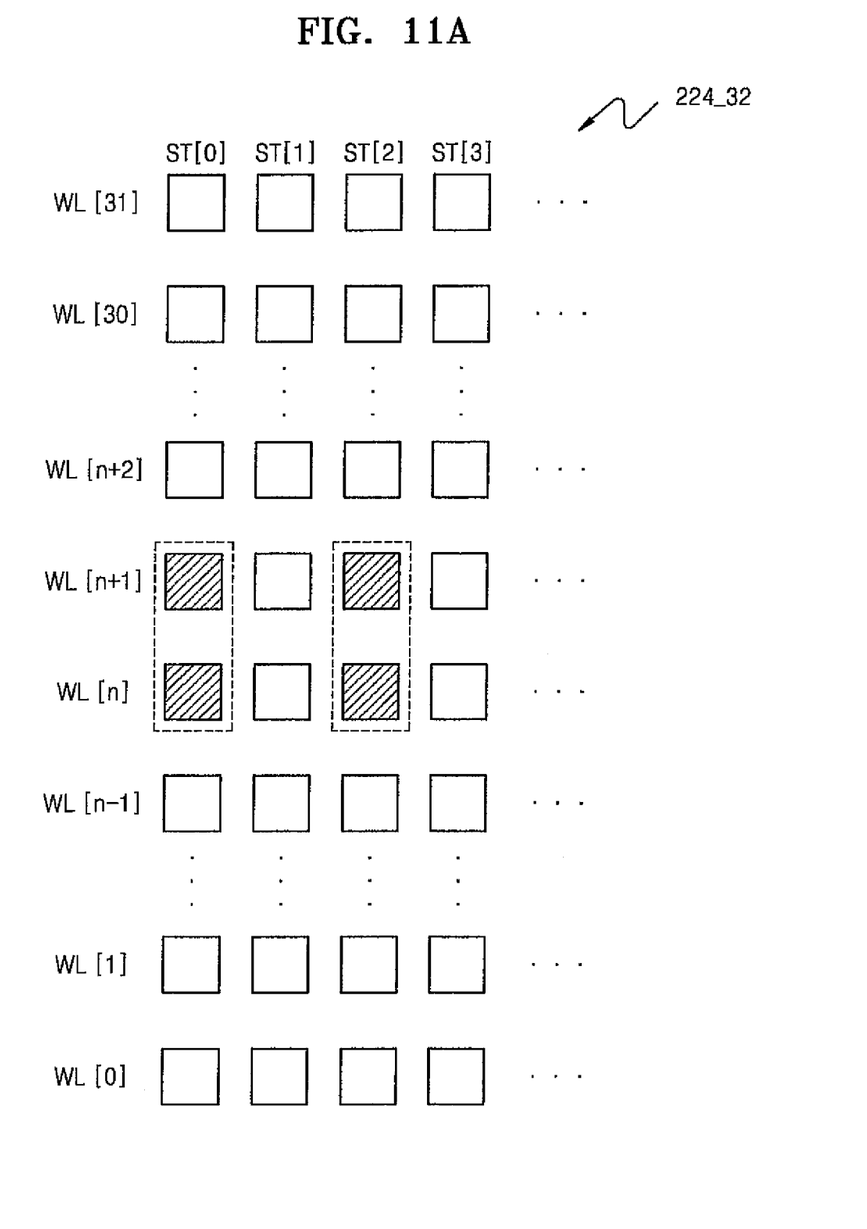
Figure 11B:
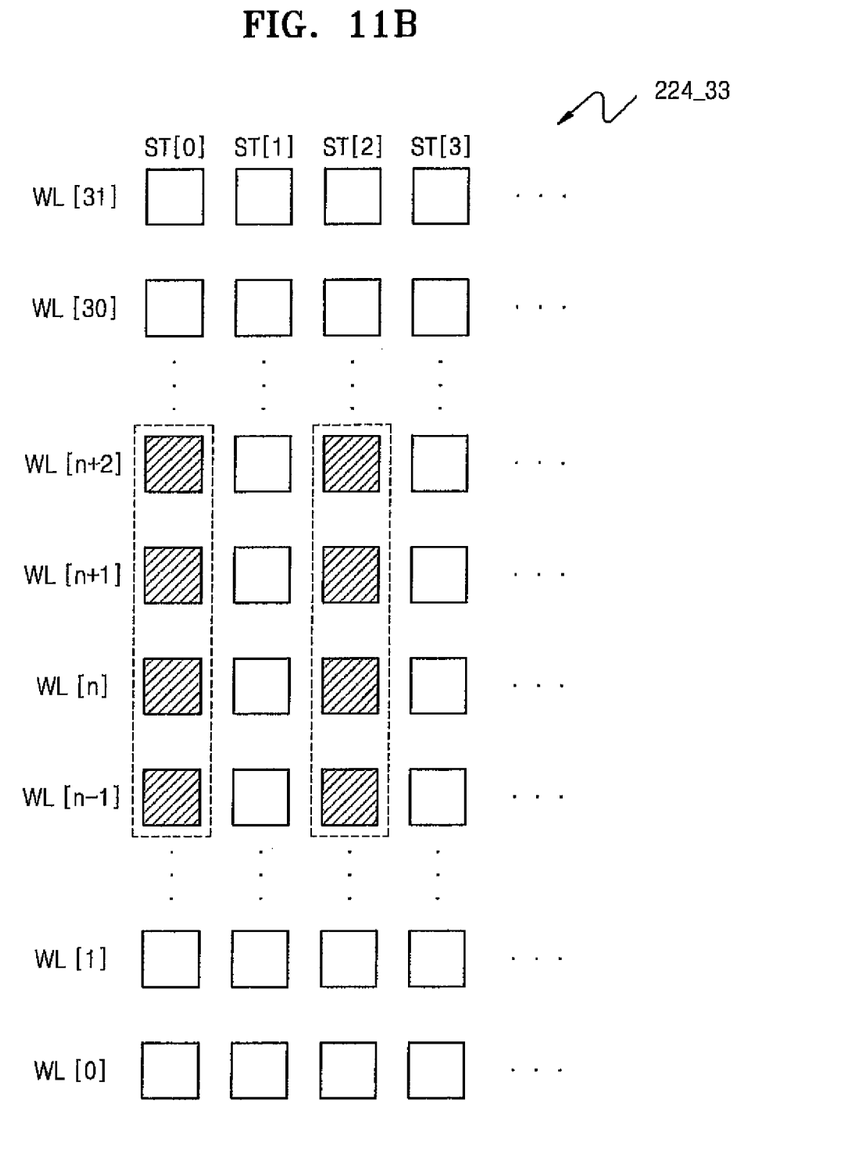
Figure 12:
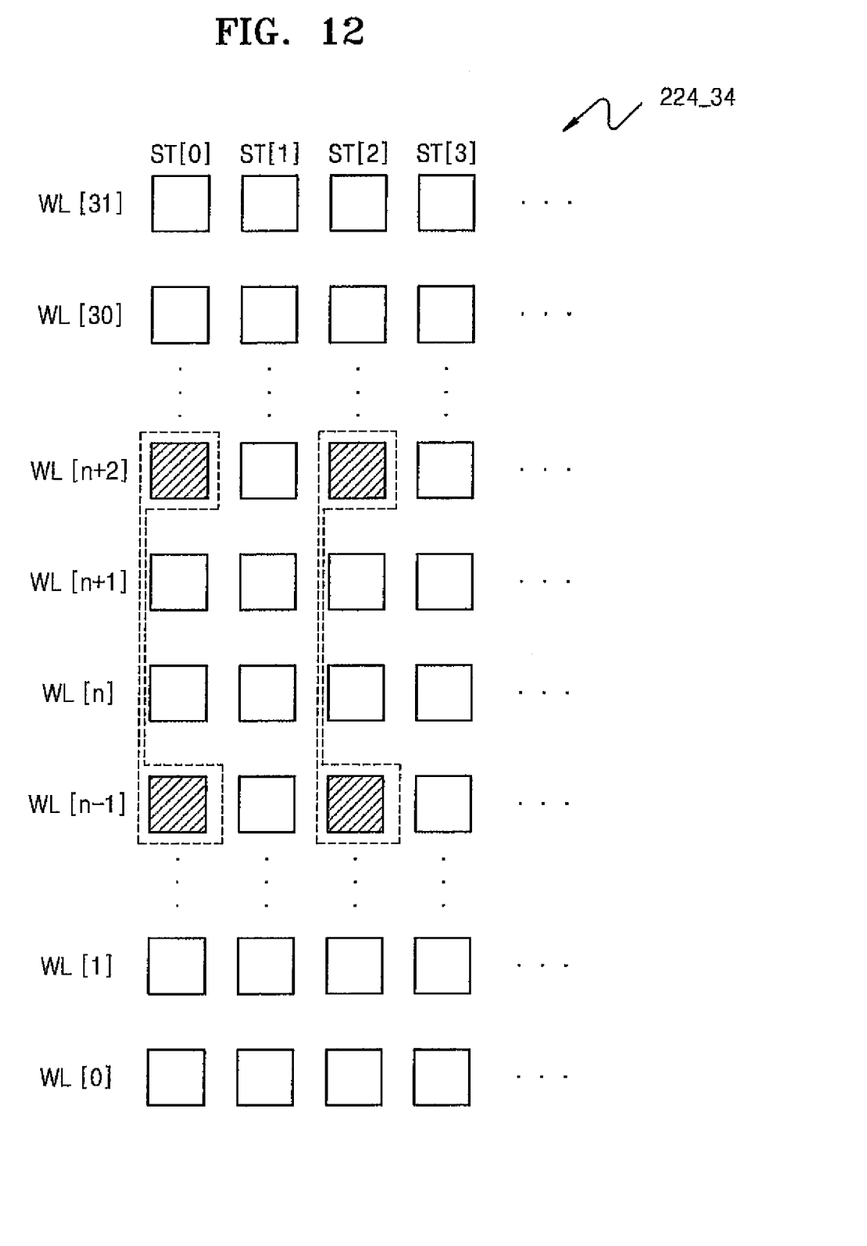

FIGS. 10 through 12 are diagrams illustrating methods of storing E-Fuse data EDTA, according to additional exemplary embodiments of the present invention.

Referring to FIGS. 10 through 12, in the depicted methods of storing E-Fuse data EDTA, the E-Fuse data EDTA are stored only in certain strings of the strings ST[0], ST[1], ST[2] and ST[3] in an E-Fuse block, one bit per memory cell, which strings are separated from each other by other strings. Specifically, in FIGS. 10 through 12, referring to the strings ST[0], ST[1], ST[2] and ST[3] of the E-Fuse block as first through nth strings in order of location, E-Fuse data EDTA are stored in the 2k−1th strings, wherein n and k are natural numbers. For example, for k=1 and 2, the E-Fuse data EDTA are stored in the first and third strings ST[0] and ST[2].

In the methods of storing E-Fuse data EDTA, according to the depicted embodiments, as in the previously described embodiments, the same bit value of the E-Fuse data EDTA can be stored in one memory cell of selected strings ST[0], ST[1], ST[2] and/or ST[3], as illustrated in FIG. 10, or stored in groups of multiple memory cells within the selected strings ST[0], ST[1], ST[2] and/or ST[3], as illustrated in FIGS. 11A, 11B and 12. Also, when the same bit value is stored in multiple memory cells of a string, the memory cells may be located in adjacent memory cells (in adjacent word lines), as illustrated in FIG. 11A, showing the E-Fuse data EDTA stored in two adjacent memory cells in strings ST[0] and ST[2], and in FIG. 11B, showing the E-Fuse data EDTA stored in four adjacent memory cells in strings ST[0] and ST[2]. Alternatively, the memory cells may be separated from each other by intervening word lines, as illustrated in FIG. 12, showing the E-Fuse data EDTA stored in two memory cells in world lines WL[n−1] and WL[n+2] of strings ST[0] and ST[2], separated by intervening word lines WL[n] and WL[n+1].

As described above, using the methods for storing E-Fuse data EDTA according to the exemplary embodiments of the present invention, a back pattern effect and a coupling phenomenon can be prevented. Moreover, a read disturb phenomenon, in which data to be read is affected by high voltage applied to unselected word lines while reading the data, between adjacent memory cells can be prevented. Accordingly, the E-Fuse data EDTA can be reliably read.

Using the method of storing E-Fuse data in a flash memory device according to embodiments of the present invention, an operating environment of the flash memory device can be accurately established by reliably reading the E-Fuse data.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of storing configuration data regarding an operating environment of a flash memory device, the flash memory device comprising a memory cell array having an electrical fuse (E-Fuse) block for storing the configuration data, the configuration data comprising a first bit and a second bit, and the E-Fuse block comprising a first string and a second string, each string comprising a plurality of memory cells connected in series, the method comprising:

storing the first bit of the configuration data in multiple memory cells of the first string and the second bit of the configuration data in multiple memory cells of the second string in the E-Fuse block, wherein the memory cells storing the first bit or the second bit of the configuration data are in one of a program state or an erase state, and the remaining memory cells which do not the configuration data are in the erase state.

2. The method of claim 1, wherein the configuration data comprises DC trim information, option information, repair information and bad block information, used for operating the flash memory device.

3. The method of claim 1, wherein the first string and the second string are adjacent to each other or separated from each other.

4. The method of claim 1, wherein the first bit and the second bit are stored in adjacent memory cells of the plurality of strings connected to one word line.

5. The method of claim 1, wherein each bit value of the configuration data are stored in a plurality of memory cells of each corresponding string.

6. The method of claim 5, wherein the configuration data are stored in adjacent memory cells of the plurality of strings connected to a plurality of word lines.

7. The method of claim 6, wherein the plurality of word lines are adjacent to each other or separated from each other by at least one intervening word line.

8. The method of claim 1, wherein the E-Fuse block comprises:
a first area which stores the configuration data; and
a second area which does not store the configuration data.

9. The method of claim 1, wherein the configuration data are stored in a first word line and a second word line in a zigzag formation.

10. The method of claim 9, wherein the first word line and the second word line are adjacent to each other or separated from each other by at least one intervening word line.

11. The method of claim 1, wherein the configuration data are stored in a first word line group and a second word line group in a zigzag formation, each word line group comprising a plurality of memory cells storing the same bit value.

12. The method of claim 11, wherein the first word line group and the second word line group are adjacent to each other or separated from each other by at least one intervening word line.

13. The method of claim 11, wherein the plurality of memory cells in each word line group are adjacent to each other or separated from each other by at least one intervening memory cell on a corresponding string.

14. The method of claim 1, wherein the memory cells storing the first bit of the configuration data and the memory cells storing the second bit of the configuration data are connected to different word lines.

15. The method of claim 14, wherein a first word line group connected to the memory cells storing the first bit and a second word line group connected to the memory cells storing the second bit are adjacent to each other.

16. The method of claim 14, wherein a first word line group connected to the memory cells storing the first bit and a second word line group connected to the memory cells storing the second bit are separated from each other by at least one intervening word line.

17. The method of claim 1, wherein each of the memory cells storing the first bit of the configuration data is connected to separated word lines by at least one intervening word line.

18. The method of claim 1, wherein each of the memory cells storing the second bit of the configuration data is connected to separated word lines by at least one intervening word line.

19. The method of claim 1, wherein the first string and the second string are adjacent to each other.

20. The method of claim 1, wherein the first string and the second string are separated from each other.

21. A method of storing configuration data regarding an operating environment of a flash memory device, the flash memory device comprising a memory cell array having an electrical fuse (E-Fuse) block for storing the configuration data, the configuration data comprising a first bit and a second bit, and the E-Fuse block comprising a first string and a second string, each string comprising a plurality of memory cells connected in series and separated from each other, the method comprising:

storing the first bit in at least two memory cells of the first string and the second bit in at least two memory cells of the second string in the E-Fuse block, the memory cells storing the first bit or the second bit of the configuration data are in one of a program state or an erase state, and the remaining memory cells that do not store the configuration data are in the erase state.

22. The method of claim 21, wherein, when the plurality of strings of the E-Fuse block comprise a first string through an nth string in order of location, the configuration data are stored in the 2k−1th strings, where n and k are natural numbers.

23. The method of claim 21, wherein each bit value of the configuration data are stored in a plurality of memory cells of each corresponding string, wherein the configuration data are stored in memory cells connected to a plurality of word lines.

24. The method of claim 23, wherein the word lines are adjacent to each other or separated from each other by at least one intervening word line.

25. The method of claim 21, wherein memory cells of the E-Fuse block that do not store the configuration data are in an erase state.

\* \* \* \* \*